US012628623B2

(12) United States Patent
Shen et al.

(10) Patent No.: US 12,628,623 B2
(45) Date of Patent: May 12, 2026

(54) SELECTIVE DEPOSITION FOR SUB 20 NM PITCH EUV PATTERNING

(71) Applicant: Applied Materials, Inc., Santa Clara, CA (US)

(72) Inventors: Zeqing Shen, San Jose, CA (US); Xinke Wang, Singapore (SG); Susmit Singha Roy, Campbell, CA (US); Abhijit Basu Mallick, Sunnyvale, CA (US); Bhaskar Jyoti Bhuyan, San Jose, CA (US); John Sudijono, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 844 days.

(21) Appl. No.: 17/880,797

(22) Filed: Aug. 4, 2022

(65) Prior Publication Data

US 2024/0055255 A1 Feb. 15, 2024

(51) Int. Cl.
*H10P 76/40* (2026.01)
*H10P 14/60* (2026.01)

(52) U.S. Cl.
CPC ...... *H10P 76/4085* (2026.01); *H10P 14/6334* (2026.01); *H10P 14/6529* (2026.01); *H10P 14/6682* (2026.01)

(58) Field of Classification Search
CPC ........... H01L 21/0337; H01L 21/02211; H01L 21/02271; H01L 21/02337
See application file for complete search history.

(56) References Cited

U.S. PATENT DOCUMENTS

| | | | |
|---|---|---|---|
| 2010/0248476 | A1 | 9/2010 | Sera et al. |
| 2012/0045900 | A1 | 2/2012 | Watanabe et al. |
| 2017/0352533 | A1 * | 12/2017 | Tois .................. H01L 21/28562 |
| 2018/0342388 | A1 | 11/2018 | Chakraborty et al. |
| 2019/0157079 | A1 | 5/2019 | Ke et al. |
| 2021/0118684 | A1 * | 4/2021 | Todd ................. H01L 21/02312 |

(Continued)

OTHER PUBLICATIONS

Klepper, Karina Barnholt, et al., "Atomic layer deposition of organic-inorganic hybrid materials based on saturated linear carboxylic acids", Dalton Trans., 2011, 40, 4636.

(Continued)

*Primary Examiner* — Kelly M Gambetta
(74) *Attorney, Agent, or Firm* — Servilla Whitney LLC

(57) ABSTRACT

Methods of selectively depositing a carbon-containing layer are described. Exemplary processing methods may include treating a substrate comprising a carbon-containing surface and a silicon-containing surface with one or more of ozone or hydrogen peroxide to passivate the silicon-containing surface. In one or more embodiments, a carbon-containing layer is then selectively deposited on the carbon-containing surface and not on the silicon-containing surface by flowing a first precursor over the substrate to form a first portion of an initial carbon-containing film on the carbon-containing surface and not on the silicon-containing surface. The methods may include removing a first precursor effluent from the substrate. A second precursor may then be flowed over the substrate to react with the first portion of the initial carbon-containing layer. The methods may include removing a second precursor effluent from the substrate.

20 Claims, 3 Drawing Sheets

100

(56) References Cited

U.S. PATENT DOCUMENTS

| | | | |
|---|---|---|---|
| 2021/0175092 A1 | 6/2021 | Tois et al. | |
| 2022/0005688 A1 | 1/2022 | Fung et al. | |
| 2022/0028686 A1 | 1/2022 | Bhuyan et al. | |
| 2023/0326755 A1* | 10/2023 | Lutker-Lee ....... | H01L 21/31144 |

OTHER PUBLICATIONS

Liu, Eric , et al., "Line edge roughness (LER) reduction strategies for EUV self-aligned double patterning (SADP)", Proc. of SPIE vol. 11615 1161506-1.

Oyakhire, Solomon T., et al., "Methyl-methacrylate based aluminum hybrid film grown via three-precursor molecular layer deposition", J. Vac. Sci. Technol. A 40, 023405 (2022); https://doi.org/10.1116/6.0001505.

Wada, Toshiharu , et al., "Line Roughness Improvements on EUV 36nm Pitch Pattern by Plasma Treatment Method", Proc. of SPIE vol. 10963 1096301-1.

Zhang, Chao , et al., "Area-Selective Molecular Layer Deposition of Polyimide on Cu through Cu-Catalyzed Formation of a Crystalline Interchain Polyimide", Chem. Mater. 2020, 32, 5073-5083.

PCT International Search Report and Written Opinion in PCT/US2023/029429 dated Nov. 24, 2023, 9 pages.

* cited by examiner

SELECTIVE DEPOSITION FOR SUB 20 NM PITCH EUV PATTERNING

TECHNICAL FIELD

Embodiments of the disclosure relate to methods for selectively depositing a carbon-based film. In particular, embodiments of the disclosure are directed to methods of depositing carbon-based layers selectively on carbon-containing surfaces over silicon-containing surfaces, such as silicon and silicon oxide ($SiO_x$) surfaces.

BACKGROUND

Photolithography employs photoresists, which are photosensitive films, for transfer of negative or positive images onto a substrate, e.g., a semiconductor wafer. Subsequent to coating a substrate with a photoresist, the coated substrate is exposed to a source of activating radiation, which causes a chemical transformation in the exposed areas of the surface. The photoresist coated substrate is then treated with a developer solution to dissolve or otherwise remove either the radiation-exposed or unexposed areas of the coated substrate, depending on the type of photoresist employed.

Current EUV patterning processes suffer from inefficient underlayer opening. The tapered shape of chemically amplified resists (CAR) and the limited height of the CAR versus the underlayer may lead to inefficient underlayer etch-through in small pitch EUV patterning. Current approaches to solving these issues involve increasing CAR thickness before EUV exposure and development, and increasing CAR etch selectivity versus underlayer by metal doping. These approaches, however, can lead to bridging defects or left over hard-to-remove CAR residue.

There is an ongoing need in the art, therefore, for methods to improve deposition selectivity and to avoid the problems encountered during EUV patterning.

SUMMARY

One or more embodiments of the disclosure are directed to a method of selectively depositing a film. A method of selectively depositing a film comprises: flowing a first precursor over a substrate comprising a carbon-containing surface and a silicon-containing surface to form a first portion of a carbon-containing layer on the carbon-containing surface, the first precursor comprising a first reactive group; removing a first precursor effluent comprising the first precursor from the substrate; flowing a second precursor comprising a second reactive group over the substrate to react with the first reactive group to form the carbon-containing layer on the carbon-containing surface of the substrate and not on the silicon-containing surface; and removing a second precursor effluent comprising the second precursor from the substrate.

Another embodiment of the disclosure is directed to a method of selectively depositing a film. In one or more embodiments, a method of selectively depositing a film comprises treating a substrate comprising a carbon-containing surface and a silicon-containing surface with one or more of ozone or hydrogen peroxide to form hydroxide groups on the silicon-containing surface; exposing the silicon-containing surface and the hydroxide groups to an alkylating precursor to form a passivated surface, wherein the alkylating precursor has a general formula (A)

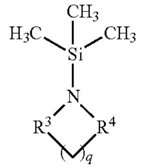

(A)

wherein $R^3$ and $R^4$ independently comprise one or more of hydrogen, an alkyl group, a halide, an alkenyl group, an aryl or aromatic group, a cycloalkyl group, and a trimethylsilyl group ($Si(CH_3)_3$), and wherein q is an integer in a range of from 0 to 5; flowing a first precursor over the substrate, the first precursor having a general formula $R^1—(X)_n$ wherein $R^1$ comprises one or more of an alkyl group, an alkenyl group, an aryl or aromatic group, and a cycloalkyl group, $X_n$ comprises one or more of a hydroxide group, an aldehyde group, a ketone group, an acid group, an amino group, an isocyanate group, a thiocyanate group, and an acyl chloride group, and n is an integer in a range of from 1 to 6, wherein the first precursor reacts with a reactive group on the carbon-containing surface to form a first portion of a carbon-containing layer on the carbon-containing surface; removing a first precursor effluent comprising the first precursor from the substrate; flowing a second precursor over the substrate to form a carbon-containing layer on the carbon-containing surface and not on the passivated surface, the second precursor having a general formula $R^2—(Y)_n$ wherein $R^2$ comprises one or more of an alkyl group, an alkenyl group, an aryl or an aromatic group, and a cycloalkyl group, $Y_n$ comprises one or more of a hydroxide group, an aldehyde group, a ketone group, an acid group, an amino group, an isocyanate group, a thiocyanate group, and an acyl chloride group, and n is an integer in a range of from 1 to 6, wherein the second precursor reacts with the first portion to form the carbon-containing layer; and removing a second precursor effluent comprising the second precursor from the substrate.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
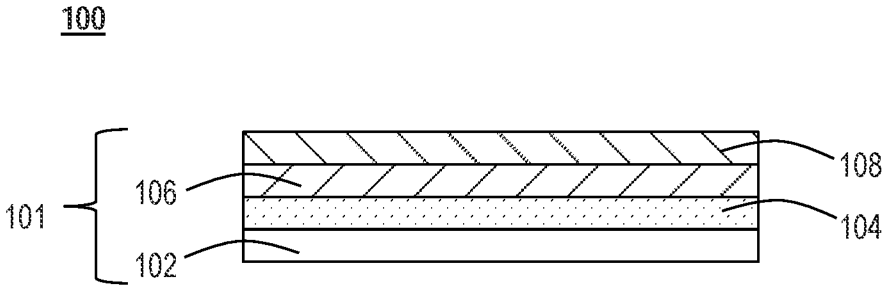
FIG. 1 illustrates cross-section view of a substrate according to one or more embodiments.

Before describing several exemplary embodiments of the invention, it is to be understood that the invention is not limited to the details of construction or process steps set forth in the following description. The invention is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" or "substrate surface", as used herein, refers to any portion of a substrate or portion of a material surface formed on a substrate upon which film processing is performed. For example, a substrate surface on which processing can be performed includes materials such as silicon, silicon oxide, silicon nitride, doped silicon, germanium, gallium arsenide, glass, sapphire, and any other materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate. Substrates may have various dimensions, such as 200 mm or 300 mm diameter wafers, as well as rectangular or square panes. In some embodiments, the substrate comprises a rigid discrete material.

The term "on" indicates that there is direct contact between elements. The term "directly on" indicates that there is direct contact between elements with no intervening elements.

As used herein, "extreme UV", "EUV", or the like, refers to radiation in the approximate range of 10 nm to 124 nm. In some embodiments, EUV radiation, extreme ultraviolet (also referred to as EUV light) is in the range of 10 nm to 15 nm. In one or more embodiments, EUV light at a wavelength of about 13.5 nm is employed.

As used in this specification and the appended claims, the terms "precursor," "reactant," "reactive gas" and the like are used interchangeably to refer to any gaseous species that can react with the substrate surface.

As used in this specification and the appended claims, the terms "reactive compound", "reactive gas", "reactive species", "precursor", "process gas" and the like are used interchangeably to mean a substance with a species capable of reacting with the substrate or material on the substrate in a surface reaction (e.g., chemisorption, oxidation, reduction, cycloaddition). The substrate, or portion of the substrate, is exposed sequentially to the two or more reactive compounds which are introduced into a reaction zone of a processing chamber.

As used in this specification and the appended claims, the term "carbon-containing surface" refers to a surface, a layer, or portion of a surface, which contains carbon. The carbon-containing surface may contain any suitable amount of carbon. For example, is some embodiments, the carbon-containing surface is a photoresist comprised of a polymeric material that contains carbon. In one or more embodiments, the carbon-containing surface comprises a chemical amplified resist (CAR) layer of an EUV photoresist. In other embodiments, the carbon-containing surface may comprise a layer of amorphous carbon.

As used in this specification and the appended claims, the term "silicon-containing surface" refers to a surface, a layer, or portion of a surface, which contains silicon. The silicon-containing surface may contain any suitable amount of silicon. In one or more embodiments, the silicon-containing surface comprises a spin-on-glass layer that is under a photoresist layer.

Carbon-containing materials may be used in semiconductor device manufacturing for a number of structures and processes, including as a mask material, an etch resistant material, and a trench fill material, among other applications. More specific examples of applications for carbon-containing materials include the formation of hot implant hard masks, metal gate (MG)-cut hard masks, metal gate fabrication, and reverse tone patterning, self-aligned patterning, among others. The present technology includes the selective formation of these carbon-containing materials on carbon-containing surfaces using molecular layer deposition (MLD).

In one or more embodiments, the substrate is an EUV substrate used for EUV development and processing. Thus, in one or more embodiments, the substrate comprises a chemical amplified resist (CAR) layer on one or more of a spin-on-glass layer, a hardmask layer, and a target layer. In small pitch EUV patterning, there is inefficient underlayer etch-through that may be caused by tapered CAR shape and limited CAR height/ES versus the underlayer. To address this problem, before EUV exposure and development, the CAR thickness may be increased, and CAR etch selectivity versus underlayer is increased by metal doping. These approaches, however, lead to CAR partial development and bridging defects and can cause either bridging defects in underlayer (when ES of CAR is not high enough) or left over hard-to-remove CAR residue. One or more embodiments advantageously uses selective deposition of a carbon-containing layer on the carbon-containing surface of the substrate while not on the silicon-containing surface, e.g., silicon or silicon oxide, of the substrate to address the problems discussed.

The method of one or more embodiments advantageously combines silicon or silicon oxide surface passivation with molecular layer deposition (MLD) of a carbon-containing film to achieve controllable profile repair and height replenishing of the CAR. In one or more embodiments, the method advantageously results in no bridging defects, no hard-to-remove CAR residue, well-controlled process flow, efficient underlayer etch through with controllable non-tapered profile transfer, and high potential for smaller pitch patterning.

Embodiments of the present technology include processing methods to selectively form a carbon-containing material on a carbon-containing surface while substantially no carbon-containing material is deposited on a silicon-containing surface, e.g., silicon (Si) surface or silicon oxide ($SiO_x$) surface. In one or more embodiments, the carbon-containing film is selectively formed on the carbon-containing surface by molecular layer deposition (MLD).

In one or more embodiments, a carbon-containing surface can be pre-treated or passivated and molecular layer deposition (MLD) can be used to form a carbon-containing layer selectively on the carbon-containing surface and not on the silicon-containing surface.

In other embodiments, a substrate having a carbon-containing surface and a silicon-containing surface, e.g., silicon (Si) or silicon oxide ($SiO_x$), is treated with one or more of ozone ($O_3$) or hydrogen peroxide ($H_2O_2$) to form hydroxide groups (—OH) on the silicon or silicon oxide surface. The substrate is then exposed to an alkylating precursor that interacts or reacts with the hydroxide groups (—OH) to form a passivated surface on the silicon or silicon oxide surface.

Exemplary MLD methods may include providing a first deposition precursor to a carbon-containing surface of a substrate, where the precursor forms a first layer (e.g., a first monolayer) on surfaces. During or after the formation of the first layer, unbound deposition effluents, which may include unbound molecules of the first deposition precursor, are removed from a processing region in which the semiconductor substrate is exposed. A second deposition precursor may then be introduced to the substrate, where molecules of the second deposition precursor bind to reactive moieties on the first layer to form a second layer (e.g., a second monolayer) on the carbon-containing surface and not or much less on the non-metal surface. During or after the formation of the second layer, unbound deposition effluent, which may include unbound molecules of the second deposition precursor, are removed from the processing region. The substrate now has a carbon containing material layer bound to the carbon-containing surface of the substrate, and no or less carbon containing material deposited on the silicon or silicon oxide surface. Additional compound layers of first and second layers may be built up on the deposited layers until the number of built-up compound layers reaches a desired thickness of carbon-containing material on the carbon-containing surface of the substrate. The compound layers may then be annealed, or plasma treated to form the carbon-containing material on the carbon-containing surface of the substrate.

One or more embodiments advantageously provides solutions to problems with conventional methods of forming a carbon-containing material on a semiconductor substrate. For example, the present technology forms a carbon-containing material with significantly fewer voids, fractures, and other physical defects than carbon-containing materials formed using spin-on-carbon (SOC) and flowable chemical-vapor-deposition (FCVD) methods. The present technology may also form carbon-containing materials with higher density and lower porosity than materials formed with SOC and FCVD. The high levels of hydrogen found in many SOCS and FCVD precursors result in high levels of shrinkage when the as-deposited materials are treated to form a final material. Shrinkage as high as 50 vol. % is not uncommon for as-deposited SOC and FCVD materials following treatment, which creates gaps, fractures, and voids in treated material, as well as stresses on substrate features in contact with the material. The present technology produces treated carbon-containing materials with less than 10 vol. % shrinkage of the as-deposited material (e.g., 5-10 vol. % shrinkage, less than about 5 vol. % shrinkage).

One or more embodiments advantageously provides solutions to problems with conventional plasma deposition methods of forming a carbon-containing material on a semiconductor substrate. Conventional plasma deposition methods such as plasma-enhanced chemical-vapor-deposition (PECVD) and high-density-plasma chemical-vapor-deposition (HDPCVD) often create ion sputtering that causes damage to substrate features on the semiconductor substrate and can also create re-sputtered ions and other species that can cause defects in the deposited carbon-containing material. In addition, they often deposit the material unevenly in and around substrate features, creating voids in and around substrate trenches and steps, and uneven surfaces in planar substrate regions. The present technology may form carbon-containing materials with a high level of conformity in narrow substrate features (e.g., dimension widths less than about 25 nm) and high aspect ratios (e.g., AR of 10:1 or more) without the need for plasmas that can damage the substrate feature during deposition.

The embodiments of the disclosure are described by way of the Figures, which illustrate devices (e.g., transistors) and processes for forming semiconductor structures in accordance with one or more embodiments of the disclosure. The processes shown are merely illustrative possible uses for the disclosed processes, and the skilled artisan will recognize that the disclosed processes are not limited to the illustrated applications.

FIGS. 1-7 illustrate cross-sectional views of a semiconductor substrate being processed according to the method of one or more embodiments. FIG. 8 illustrates a process flow diagram of a method 200 of selectively depositing a film according to one or more embodiments. Referring to FIG. 1 and FIG. 8, in one or more embodiments, at operation 202, a substrate 101 is provided. As used in this specification and the appended claims, the term "provided" means that the substrate 101 is made available for processing (e.g., positioned in a processing chamber).

With reference to FIG. 1, in one or more embodiments, a substrate 101 includes one or more of a chemical amplified resist (CAR) layer 108 on one or more of silicon-containing layer 106, a hardmask layer 104, and a target layer 102. In some embodiments, the chemical amplified resist (CAR) layer 108 comprises carbon. In one or more embodiments, the silicon-containing layer 106 is a spin-on-glass layer comprising silicon or silicon oxide ($SiO_x$). It will be appreciated by one of skill in the art that the silicon-containing layer 106 has a silicon or silicon oxide ($SiO_x$) surface. In one or more embodiments, a carbon containing layer has growth only on certain carbon-containing surfaces, while no growth or much less growth on passivated silicon or silicon oxide surfaces. The selectivity (the ratio of thickness on different surfaces) can be 2:1, 5:1, 10:1, 50:1, 100:1, or absolute selective growth (no growth on undesired surface).

Figure 2:
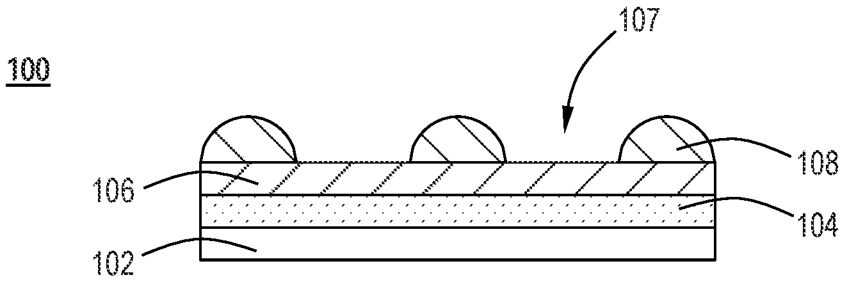
FIG. 2 illustrates cross-section view of a substrate according to one or more embodiments.

Referring to FIG. 2, in one or more embodiments, the substrate 101 on which a carbon-containing material is selectively formed may include a material in which one or more features 107 may be formed. The substrate 101 features may be characterized by any shape or configuration according to the present technology. In some embodiments, the features 107 may be or include a trench structure, a via structure, or aperture formed within the substrate. Although the substrate features may be characterized by any shapes or sizes, in some embodiments the substrate features may be characterized by higher aspect ratios, or a ratio of a depth of the feature to a width across the feature. For example, in some embodiments substrate features may be characterized by aspect ratios greater than or equal to 5:1, and may be characterized by aspect ratios greater than or equal to 10:1, greater than or equal to 15:1, greater than or equal to 20:1, greater than or equal to 25:1, greater than or equal to 30:1, greater than or equal to 40:1, greater than or equal to 50:1, or greater.

Additionally, the features may be characterized by narrow widths or diameters across the feature including between two sidewalls, such as a dimension less than or equal to 20 nm, and may be characterized by a width across the feature of less than or equal to 15 nm, less than or equal to 12 nm, less than or equal to 10 nm, less than or equal to 9 nm, less than or equal to 8 nm, less than or equal to 7 nm, less than or equal to 6 nm, less than or equal to 5 nm, or less.

Figure 3A:
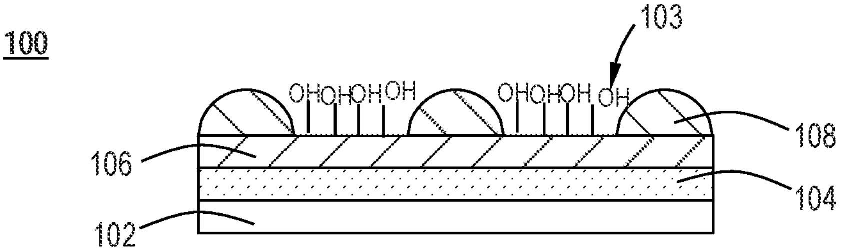
FIG. 3A illustrates cross-section view of a substrate according to one or more embodiments.
Figure 3B:
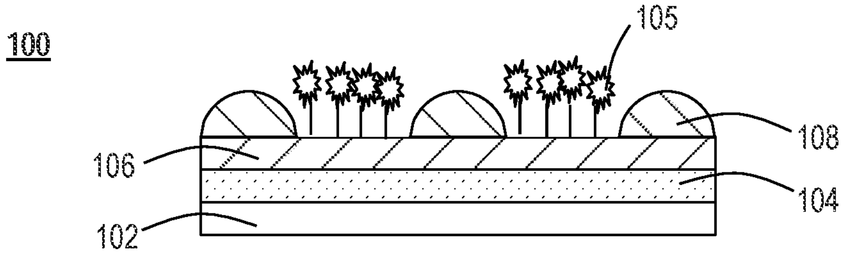
FIG. 3B illustrates cross-section view of a substrate according to one or more embodiments.

With references to FIGS. 3A-3B and FIG. 8, in one or more embodiments, at operation 204, the substrate 101 may optionally be exposed to a treatment process to passivate the substrate 101. Specifically, in one or more embodiments, the substrate 101 may be exposed to a treatment process to passivate the silicon-containing layer 106 and not the carbon-containing surface 108. In some embodiments, a substrate 101 having a carbon-containing surface (i.e., CAR layer 108) and a silicon-containing layer 106 including a silicon (Si) or silicon oxide ($SiO_x$) surface (i.e., spin-on-glass layer 106) is treated with one or more of ozone ($O_3$) or hydrogen peroxide ($H_2O_2$) to form hydroxide groups (—OH) 103 on the silicon or silicon oxide surface of the silicon-containing layer 106.

In one or more embodiments, referring to FIG. 3B, the substrate 101 is then exposed to an alkylating precursor that interacts or reacts with the hydroxide groups (—OH) to form a passivated surface 105 on the silicon or silicon oxide surface of the silicon-containing layer 106.

Without intending to be by bound by theory, it is thought that passivating the silicon or silicon oxide surface of the silicon-containing layer 106 with ozone or hydrogen peroxide followed by exposure to an alkylating precursor creates a passivated surface 105 such that a carbon-containing layer cannot form on the passivated silicon or silicon oxide surface. Thus, in one or more embodiments, a carbon-containing layer 114 is selectively deposited on the carbon-containing surface 108 of the substrate and substantially not on the silicon or silicon oxide surface of the silicon-containing layer 106.

The alkylating precursor can be any suitable alkylating precursor known to the skilled artisan. In one or more embodiments, the alkylating precursor has a general formula (A)

(A)

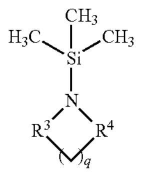

wherein $R^3$ and $R^4$ independently comprise one or more of hydrogen, an alkyl group, a halide, an alkenyl group, an aryl or aromatic group, a cycloalkyl group, and a trimethylsilyl group ($Si(CH_3)_3$), and wherein q is an integer in a range of from 0 to 5. In one or more embodiments, $R^3$ and $R^4$ are independently selected from the group consisting of H, alkyl, chloride, and trimethylsilyl. In one or more embodiments, the alkylating precursor is selected from one or more of hexamethyldisiliazane, N,N-dimethyltrimethylsilylamine, tris(trimethylsilyl)amine, chlorotrimethylsilane, 1-(Trimethylsilyl) pyrrolidine, and iodo trimethylsilane.

Unless otherwise indicated, the term "lower alkyl," "alkyl," or "alk" as used herein alone or as part of another group includes both straight and branched chain hydrocarbons, containing 1 to 20 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. The alkyl may be substituted or unsubstituted.

As used herein, the term "alkoxy" includes any of the above alkyl groups linked to an oxygen atom. The alkoxy may be substituted or unsubstituted.

As used herein, the terms "vinyl" or "vinyl-containing" refer to groups containing the vinyl group ($—CH{=}CH_2$). The vinyl may be substituted or unsubstituted.

As used herein, the term "silane" refers to a compound $SiR'_3$, wherein R' is independently selected from hydrogen (H) or alkyl. The alkyl of the silane may be substituted or unsubstituted.

As used herein, the term "halide" refers to a binary phase, of which one part is a halogen atom and the other part is an element or radical that is less electronegative than the halogen, to make a fluoride, chloride, bromide, or iodide compound. A halide ion is a halogen atom bearing a negative charge. As known to those of skill in the art, a halide anion includes fluoride (F—), chloride (Cl—), bromide (Br—), and iodide (I—).

As used in this specification and the appended claims, the phrase "selectively over," or similar phrases, means that the subject material is deposited on the stated surface to a greater extent than on another surface. In some embodiments, "selectively" means that the subject material forms on the selective surface at a rate greater than or equal to about 10×, 15×, 20×, 25×, 30×, 35×, 40×, 45× or 50× the rate of formation on the non-selected surface. Accordingly, in one or more embodiments, a carbon-containing layer 114 forms selectively on the carbon-containing surface 108 at a rate greater than or equal to about 10×, 15×, 20×, 25×, 30×, 35×, 40×, 45× or 50× the rate of formation on the non-selected surface (i.e., the passivated surface 105).

In one or more embodiments, a carbon-containing layer 114 forms on the carbon-containing surface 108 and not on the passivated surface 105 of the silicon-containing layer 106 with a selectivity ratio of at least 10:1, or at least 100:1, or at least 1000:1.

Figure 4:
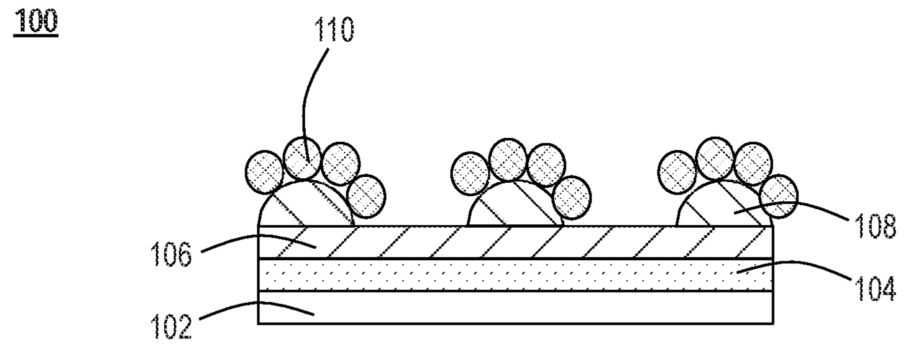
FIG. 4 illustrates cross-section view of a substrate according to one or more embodiments.

With reference to FIG. 4 and FIG. 8, at operation 206, a first type of precursor 110 is introduced/flowed into the substrate processing region of a processing chamber and over the substrate surface. The first precursor 110 binds strongly to the carbon-containing surface 108, while not binding to the silicon or silicon oxide surface 106.

In one or more embodiments, the first precursor 110 may be a carbon-containing precursor that has at least two reactive groups that can form a bond with a group attached to the carbon-containing surface 108 of a substrate 101. Molecules of the first precursor 110 react with the surface groups of the carbon-containing surface 108 to form bonds linking the first precursor 110 molecule to the carbon-containing surface 108 of the substrate. The reactions between the first precursor 110 molecules and the groups on the carbon-containing surface 108 of the substrate continue until most or all the surface groups are bonded to a reactive group on the first precursor 110 molecules. A first portion of a carbon-containing layer 114 is formed that blocks further reaction between first precursor 110 molecules in the first precursor effluent and the substrate.

The first precursor 110 may comprise any suitable precursor known to the skilled artisan. In one or more embodiments, the first precursor 110 may have a general formula $R^1$—$(X)_n$ wherein n is an integer in a range of from 1 to 6, and $R^1$ comprises one or more of an alkyl group, an alkenyl group, an aryl, or aromatic group, and a cycloalkyl group. $X_n$ comprises one or more of a hydroxide group, an aldehyde group, a ketone group, an acid group, an amino group, an isocyanate group, a thiocyanate group, and an acyl chloride group.

Unless otherwise indicated, the term "lower alkyl," "alkyl," or "alk" as used herein alone or as part of another group includes both straight and branched chain hydrocarbons, containing 1 to 20 carbons, or 1 to 10 carbon atoms, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. The alkyl may be substituted or unsubstituted.

Such alkyl groups may optionally include up to 1 to 4 substituents such as halo, for example F, Br, Cl, or I, or $CF_3$, alkyl, alkoxy, aryl, aryloxy, aryl(aryl) or diaryl, arylalkyl, arylalkyloxy, alkenyl, cycloalkyl, cycloalkylalkyl, cycloalkylalkyloxy, amino, hydroxy, hydroxyalkyl, acyl, heteroaryl, heteroaryloxy, heteroarylalkyl, heteroarylalkoxy, aryloxyalkyl, alkylthio, arylalkylthio, aryloxyaryl, alkylamido, alkanoylamino, arylcarbonylamino, nitro, cyano, thiol, haloalkyl, trihaloalkyl, and/or alkylthio, and the like. In one or more embodiments, $R^1$ is independently selected from $C_{1-20}$ alkyl. In other embodiments, $R^1$ is from $C_{1-12}$ alkyl.

As used herein, the term "alkene" or "alkenyl" or "lower alkenyl" refers to straight or branched chain radicals of 2 to 20 carbons, or 2 to 12 carbons, and 1 to 8 carbons in the normal chain, which include one to six double bonds in the normal chain, such as vinyl, 2-propenyl, 3-butenyl, 2-butenyl, 4-pentenyl, 3-pentenyl, 2-hexenyl, 3-hexenyl, 2-heptenyl, 3-heptenyl, 4-heptenyl, 3-octenyl, 3-nonenyl, 4-decenyl, 3-undecenyl, 4-dodecenyl, 4,8,12-tetradecatrienyl, and the like, and which may be optionally substituted with 1 to 4 substituents, namely, halogen, haloalkyl, alkyl, alkoxy, alkenyl, alkynyl, aryl, arylalkyl, cycloalkyl, amino, hydroxy, heteroaryl, cycloheteroalkyl, alkanoylamino, alkylamido, arylcarbonyl-amino, nitro, cyano, thiol, alkylthio, and/or any of the alkyl substituents set out herein.

As used herein, the term "alkynyl" or "lower alkynyl" refers to straight or branched chain radicals of 2 to 20 carbons, or 2 to 12 carbons, or 2 to 8 carbons in the normal chain, which include one triple bond in the normal chain, such as 2-propynyl, 3-butynyl, 2-butynyl, 4-pentynyl, 3-pentynyl, 2-hexynyl, 3-hexynyl, 2-heptynyl, 3-heptynyl, 4-heptynyl, 3-octynyl, 3-nonynyl, 4-decynyl, 3-undecynyl, 4-dodecynyl, and the like, and which may be optionally substituted with 1 to 4 substituents, namely, halogen, haloalkyl, alkyl, alkoxy, alkenyl, alkynyl, aryl, arylalkyl, cycloalkyl, amino, heteroaryl, cycloheteroalkyl, hydroxy, alkanoylamino, alkylamido, arylcarbonylamino, nitro, cyano, thiol, and/or alkylthio, and/or any of the alkyl substituents set out herein.

As used herein, the term "aryl" refers to monocyclic and bicyclic aromatic groups containing 6 to 10 carbons in the ring portion (such as phenyl, biphenyl or naphthyl, including 1-naphthyl and 2-naphthyl) and may optionally include 1 to 3 additional rings fused to a carbocyclic ring or a heterocyclic ring (such as aryl, cycloalkyl, heteroaryl, or cycloheteroalkyl rings). The aryl group may be optionally substituted through available carbon atoms with 1, 2, or 3 substituents, for example, hydrogen, halo, haloalkyl, alkyl, haloalkyl, alkoxy, haloalkoxy, alkenyl, trifluoromethyl, trifluoromethoxy, alkynyl, and the like.

Specific examples of first precursor 110 include, but are not limited to, one or more of terephthaldehyde, phenylenediamine, ethylenediamine, hexamethylenediamine, terephthaloyl chloride, 1,3,5-benzenetricarbonyl trichloride, pyromellitic dianhydride, benzene-1,3,5-tricarboxaldehyde, 1,4-phenylene diisocyanate, 4,4'-oxydianiline, tris(2-aminoethyl)amine, and the like.

In one or more embodiments, the formation rate of the first portion of the carbon-containing film may depend on the temperature of the substrate as well as the temperature of the deposition precursors that flow into the substrate processing region. Exemplary substrate temperatures during the formation operations may be greater than or equal to 50° C., greater than or equal to 60° C., greater than or equal to 70° C., greater than or equal to 80° C., greater than or equal to 90° C., greater than or equal to 100° C., greater than or equal to 110° C., greater than or equal to 120° C., greater than or equal to 130° C., greater than or equal to 140° C., greater than or equal to 150° C., or higher. By maintaining the substrate temperature elevated, such as above or about 100° C. in some embodiments, an increased number of nucleation sites may be available along the carbon-containing surface 108 of the substrate, which may improve formation and reduce void formation by improving coverage at each location.

The first precursor 110 effluent may remain in the substrate processing region for a period of time to nearly, or completely, form the first portion 108 of the carbon-containing layer 114. The precursors may be delivered in alternating pulses to grow the material. In some embodiments, the pulse times of either or both of the first precursor 110 and the second precursor 111 may be greater than or equal to 0.1 seconds, greater than or equal to 1 second, greater than or equal to 2 seconds, greater than or equal to 3 seconds, greater than or equal to 4 seconds, greater than or equal to 5 seconds, greater than or equal to 10 seconds, greater than or equal to 20 seconds, greater than or equal to 40 seconds, greater than or equal to 60 seconds, greater than or equal to 80 seconds, greater than or equal to 100 seconds, or more.

With reference to FIG. 8, at operation 208, the first precursor 110 is purged or removed from the substrate processing region following formation of the first portion 110 of the carbon-containing layer 114. The effluents of the first precursor 110 may be removed by pumping them out of the substrate deposition region for a period of time ranging from about 10 seconds to about 100 seconds. Additional exemplary time ranges may include about 20 seconds to about 50 seconds, and 25 seconds to about 45 seconds, among other exemplary time ranges. In some embodiments, however, increased purge time may begin to remove reactive sites, which may reduce uniform formation. Accordingly, in some embodiments the purge may be performed for less than or equal to 60 seconds and may be performed for less than or equal to 50 seconds, less than or equal to 40 seconds, less than or equal to 30 seconds, or less. In some embodiments, a purge gas may be introduced to the substrate processing region to assist in the removal of the effluents. Exemplary purge gases include argon (Ar), helium (He), and nitrogen ($N_2$), among other purge gases.

Figure 5:
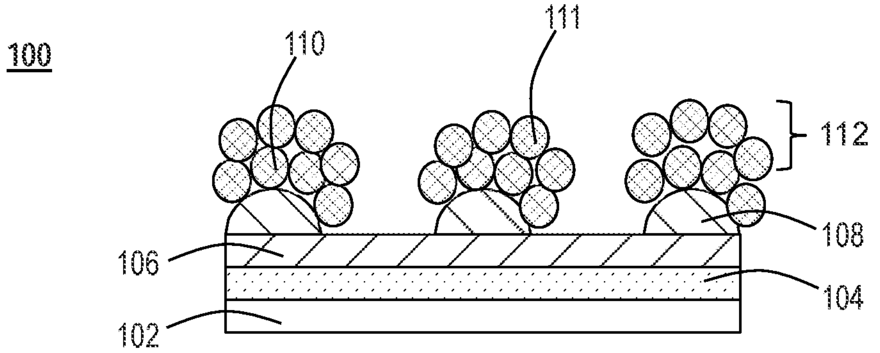
FIG. 5 illustrates cross-section view of a substrate according to one or more embodiments.

Referring to FIG. 5 and FIG. 8, at operation 210, a second type of precursor 111, reacts with the first precursor 110 to form a second portion 112 of carbon-containing layer 114. The second precursor 111 may advantageously have functional groups on one end that increase the thickness of the carbon-containing layer 114.

In one or more embodiments, the second precursor 111 may be a carbon-containing precursor that has at least two reactive groups that can form bonds with unreacted reactive groups of the first precursor 110 that formed the first portion 108 of the carbon-containing layer 114. Molecules of the second precursor 111 react with the unreacted reactive groups of the first precursor 110 to form bonds linking the second precursor 111 molecules to the first precursor 110 molecules. The reactions between the second and first precursor molecules continue until most or all the unreacted reactive groups on the first precursor 110 molecules have reacted with second precursor 111 molecules. A second portion 112 of a carbon-containing layer 114 of the deposition precursors is formed that blocks further reaction between second precursor 111 molecules in the second precursor effluent and the first portion 108 of the carbon-containing layer 114.

The second precursor 111 may comprise any suitable precursor known to the skilled artisan. In one or more embodiments, the second precursor 111 may have a general formula $R^2$—$(Y)_n$ wherein n is an integer in a range of from 1 to 6, and $R^2$ comprises one or more of an alkyl group, an alkenyl group, an aryl, or aromatic group, and a cycloalkyl group. In one or more embodiments, $R^2$ is independently selected from $C_{1-20}$ alkyl. In other embodiments, $R^2$ is from $C_{1-12}$ alkyl. $Y_n$ comprises one or more of a hydroxide group, an aldehyde group, a ketone group, an acid group, an amino group, an isocyanate group, a thiocyanate group, and an acyl chloride group.

Without intending to be bound by theory, it is thought that the second precursor 111 includes a reactive group that can form a covalent bond with a reactive group of the first precursor 110.

Specific examples of second precursor 111 include, but are not limited to, one or more of terephthaldehyde, phenylenediamine, ethylenediamine, hexamethylenediamine, terephthaloyl chloride, 1,3,5-benzenetricarbonyl trichloride, pyromellitic dianhydride, benzene-1,3,5-tricarboxaldehyde, 1,4-phenylene diisocyanate, 4,4'-Oxydianiline, tris(2-aminoethyl)amine, and the like.

Referring to FIG. 8, in one or more embodiments, the method 200 also includes an operation 212 to purge or remove the second precursor 111 effluents from the substrate processing region following the formation of the second portion of the carbon-containing layer 114. The effluents may be removed by pumping them out of the substrate deposition region for a period of time ranging from about 10 seconds to about 100 seconds. Additional exemplary time ranges may include about 20 seconds to about 50 seconds, and 25 seconds to about 45 seconds, among other exemplary time ranges. In some embodiments, a purge gas may be introduced to the substrate processing region to assist in the removal of the effluents. Exemplary purge gases include argon, helium, and nitrogen, among other purge gases.

In one or more embodiments, the formation rate of the second portion of the carbon-containing layer 114 may also depend on the pressure of the second precursor 111 effluent in the substrate processing region. Exemplary effluent pressures in the substrate processing region may range from about 1 mTorr to about 20 Torr. Additional exemplary ranges include 5 Torr to 15 Torr, and 9 Torr to 12 Torr, among other exemplary ranges.

With reference to FIG. 8, in one or more embodiments of the method 200 there is a determination/decision point 214 of whether a target thickness of the as-deposited carbon-containing layer 114 on the carbon-containing surface 108 of the substrate has been achieved following one or more cycles of forming a carbon-containing layer 114 (e.g., following the formation of the first and second portions of a compound layer). If a target thickness of as-deposited carbon-containing layer 114 has not been achieved, another cycle of forming first and second portions of a carbon-containing layer 114 is performed. If a target thickness of as-deposited carbon-containing layer 114 has been achieved, another cycle to form another carbon-containing layer 114 is not started. Exemplary numbers of cycles for the formation of carbon-containing layers may include 1 cycle to 2000 cycles. Additional exemplary ranges for the number of cycles may include 50 cycles to 1000 cycles, and 100 cycles to 750 cycles, among other exemplary ranges.

Accordingly, in one or more embodiments, the method 200 further includes depositing at least one additional carbon-containing layer on the initial carbon-containing layer, where the initial carbon-containing layer and the at least one additional carbon-containing layer form the carbon-containing layer 114 on the metal surface of the substrate.

Figure 6:
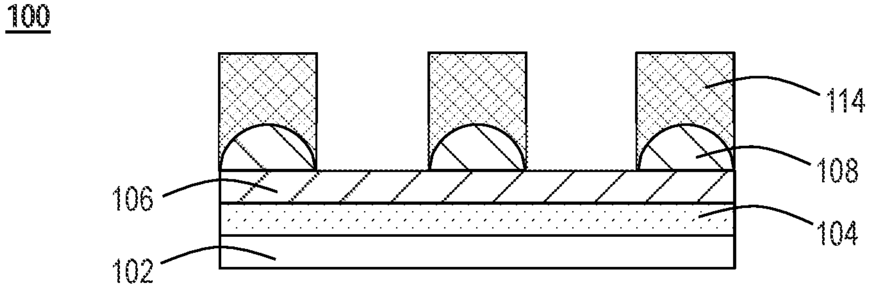
FIG. 6 illustrates cross-section view of a substrate according to one or more embodiments.

In one or more embodiments, referring to FIG. 6, the selective carbon-containing layer 114 may have any suitable thickness. In one or more embodiments, the thickness of at least 1 nm, or at least 10 nm, or at least 100 nm, or at least 200 nm, or at least 500 nm, or at least 1000 nm. Exemplary ranges of target thickness to discontinue further cycles of forming compound layers include about 10 nm to about 500 nm. Additional exemplary thickness ranges may include about 5 nm to about 20 nm, about 50 nm to about 300 nm, and 100 nm to about 200 nm, among other exemplary thickness ranges.

Figure 7:
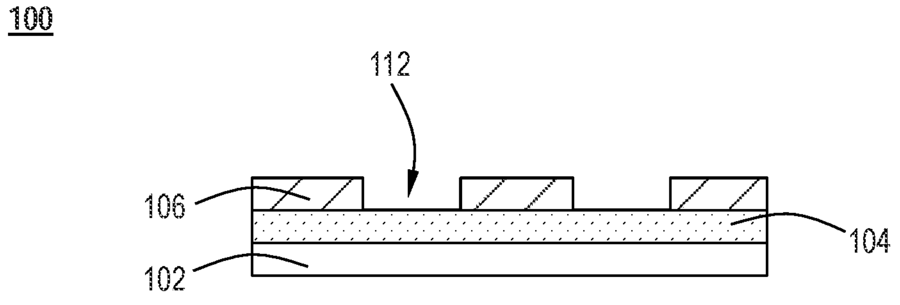
FIG. 7 illustrates cross-section view of a substrate according to one or more embodiments.
Figure 8:
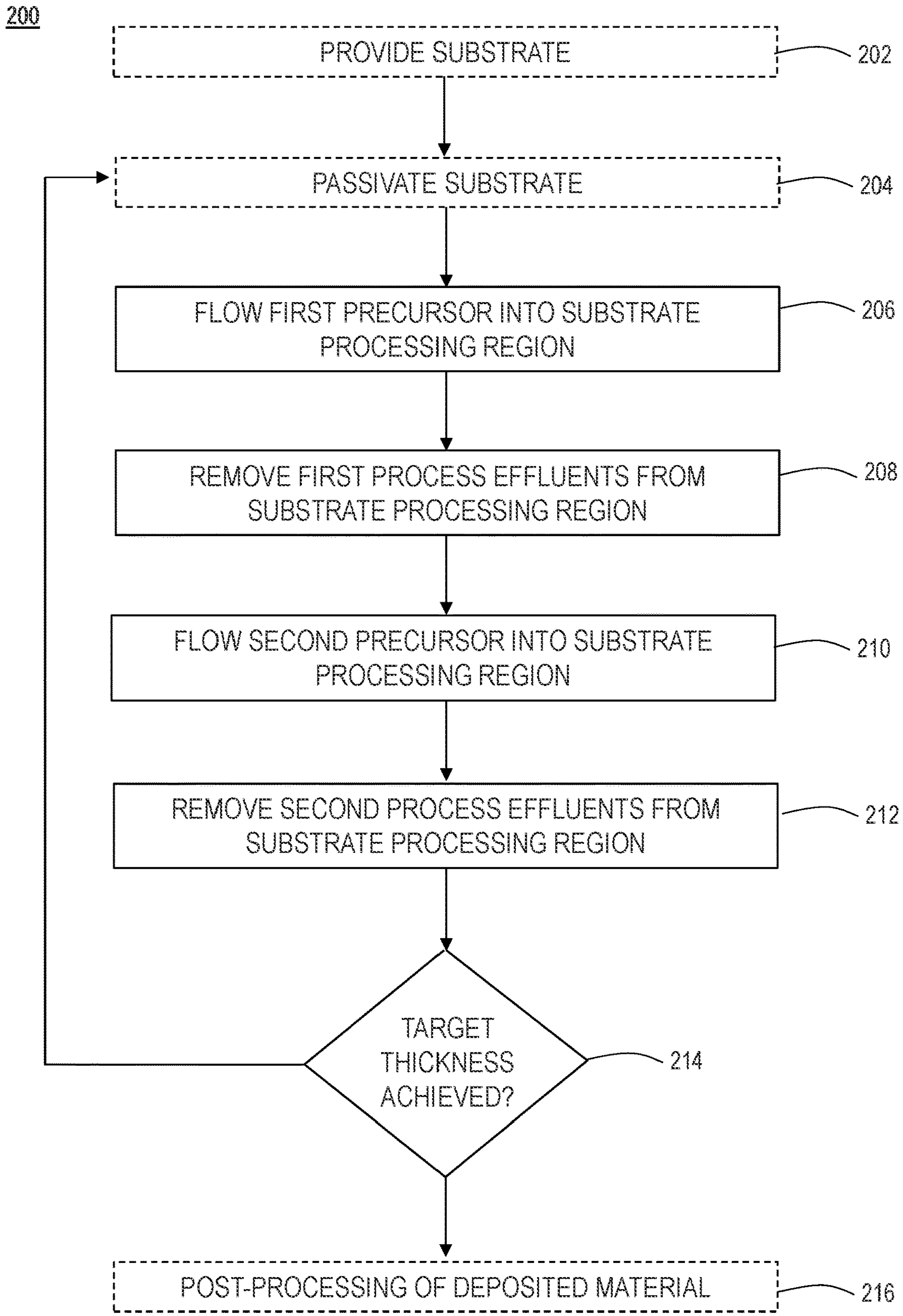
FIG. 8 illustrates a process flow diagram of a method of selectively depositing a film on a substrate according to one or more embodiments.

In the embodiment shown in method 200 of FIG. 8, the as-deposited carbon-containing layer 114 on the carbon-containing surface 108 of the substrate may be optionally post-processed at operation 216, as illustrated in FIG. 7. The optional post-processing operation 216 can be, for example, a process etch through the underlayers (hardmask layer 104 and target layer 102) to pattern the substrate 101 for EUV development.

In some embodiments, the processing region is in a modular system comprising multiple chambers which perform various functions including substrate center-finding and orientation, degassing, annealing, deposition and/or etching. According to one or more embodiments, the modular system includes at least a first processing chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Any well-known modular systems may be adapted for the present disclosure. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation, and other substrate processes. By carrying out processes in the processing chamber of modular system, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, the inert gas is used to purge or remove some or all of the reactants (e.g., reactant). According to one or more embodiments, the inert gas is injected at the exit of the processing chamber to prevent reactants (e.g., reactant) from moving from the processing chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In a spatial ALD process, the reactive gases are flowed into different processing regions within a processing chamber. The different processing regions are separated from adjacent processing regions so that the reactive gases do not mix. The substrate can be moved between the processing regions to separately expose the substrate to the reactive gases. During substrate movement, different portions of the substrate surface, or material on the substrate surface, are exposed to the two or more reactive gases so that any given point on the substrate is substantially not exposed to more than one reactive gas simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

In another aspect of the spatial ALD process, the reactive gases are delivered simultaneously to the reaction zone but are separated by an inert gas curtain and/or a vacuum curtain. The gas curtain can be combination of inert gas flows into the processing chamber and vacuum stream flows out of the processing chamber. The substrate is moved relative to the gas delivery apparatus so that any given point on the substrate is exposed to only one reactive gas.

A "pulse" or "dose" as used herein refers to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

In a time-domain ALD process in some embodiments, exposure to each reactive gas, which includes but not limited to the metal and dielectric material to be used for the ALD film, is separated by a time delay to allow each compound to adhere and/or react on the substrate surface and then be purged from the processing chamber. The reactive gases are prevented from mixing by the purging of the processing chamber between subsequent exposures.

In another aspect of a time-domain ALD process of some embodiments, a time delay exists between pulses of reactive gases. During each time delay, a purge gas, such as argon, is introduced into the processing chamber to purge the reaction zone or otherwise remove any residual reactive gas or reaction products or by-products from the reaction zone. Alternatively, the purge gas may flow continuously throughout the deposition process so that only the purge gas flows during the time delay between pulses of reactive gases. The reactive gases are alternatively pulsed with a pulse of purge gas there between multiple times. The purge may also be achieved with a vacuum pump with or without an inert gas.

The durations for each pulse/dose are variable and may be adjusted to accommodate, for example, the volume capacity of the processing chamber as well as the capabilities of a vacuum system coupled thereto. Additionally, the dose time of a reactive gas may vary according to the flow rate of the reactive gas, the temperature of the process gas, the type of control valve, the type of process chamber employed, as well as the ability of the components of the process gas to adsorb onto the substrate. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Once the carbon-containing layer is deposited, the method may optionally include further processing (e.g., EUV patterning and underlayer etch through).

The disclosure provides that the processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor or controller, transforms the general-purpose computer into a specific purpose computer (controller) that controls the chamber operation such that the processes are performed. The process can be stored on non-transitory computer readable medium including instructions, that, when executed by a controller of a substrate processing chamber, causes the substrate processing chamber to perform the operations of: flow a first precursor over a substrate comprising a carbon-containing surface and a silicon-containing surface to form a first portion of a carbon-containing layer on the carbon-containing surface, the first precursor comprising a first reactive group; remove a first precursor effluent comprising the first precursor from the substrate; flow a second precursor comprising a second reactive group over the substrate to react with the first reactive group to form the carbon-containing layer on the carbon-containing surface of the substrate and not on the silicon-containing surface; and remove a second precursor effluent comprising the second precursor from the substrate.

In one or more embodiments, the process can be stored on non-transitory computer readable medium including instructions, that, when executed by a controller of a substrate processing chamber, causes the substrate processing chamber to perform the further operations of, treat the carbon-containing surface and the silicon-containing surface with one or more of ozone or hydrogen peroxide to form hydroxide groups on the silicon-containing surface. In some embodiments, the process can be stored on non-transitory computer readable medium including instructions, that, when executed by a controller of a substrate processing chamber, causes the substrate processing chamber to perform the further operations of expose the silicon-containing surface and hydroxide groups to an alkylating precursor to form a passivated surface, wherein the alkylating precursor has a general formula (A)

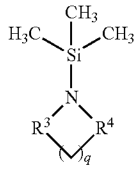

(A)

wherein $R^3$ and $R^4$ independently comprise one or more of hydrogen, an alkyl group, a halide, an alkenyl group, an aryl or aromatic group, a cycloalkyl group, and a trimethylsilyl group ($Si(CH_3)_3$), and wherein q is an integer in a range of from 0 to 5.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of selectively depositing a film, the method comprising:

treating a carbon-containing surface and a silicon-containing surface with one or more of ozone or hydrogen peroxide to form hydroxide groups on the silicon-containing surface, wherein the carbon-containing surface is a chemical amplified resist (CAR) layer and the silicon-containing surface is a spin-on-glass layer, the spin-on-glass layer on a hardmask layer on a target layer, and wherein the carbon-containing surface has at least one feature formed therein, the at least one feature having a bottom surface that is the silicon-containing surface;

exposing the silicon-containing surface and hydroxide groups to an alkylating precursor to form a passivated silicon-containing surface;

flowing a first precursor over a substrate comprising the carbon-containing surface and the passivated silicon-containing surface to form a first portion of a carbon-containing layer on the carbon-containing surface, the first precursor comprising a first reactive group;

removing a first precursor effluent comprising the first precursor from the substrate;

flowing a second precursor comprising a second reactive group over the substrate to react with the first reactive group to form the carbon-containing layer on the carbon-containing surface of the substrate and not on the silicon-containing surface; and removing a second precursor effluent comprising the second precursor from the substrate.

2. The method of claim 1, wherein the alkylating precursor has a general formula (A)

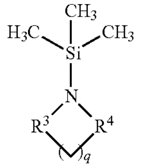

(A)

wherein $R^3$ and $R^4$ independently comprise one or more of hydrogen, an alkyl group, a halide, an alkenyl group, an aryl or aromatic group, a cycloalkyl group, and a trimethylsilyl group ($Si(CH_3)_3$), and wherein q is an integer in a range of from 0 to 5.

3. The method of claim 2, wherein the alkylating precursor is selected from one or more of hexamethyldisiliazane, N,N-dimethyltrimethylsilylamine, tris(trimethylsilyl)amine, chlorotrimethylsilane, 1-(Trimethylsilyl)pyrrolidine, and iodo trimethylsilane.

4. The method of claim 1, wherein the first precursor has a general formula $R^1$—$(X)_n$ wherein $R^1$ comprises one or more of an alkyl group, an alkenyl group, an aryl or aromatic group, and a cycloalkyl group, $X_n$ comprises one or more of a hydroxide group, an aldehyde group, a ketone group, an acid group, an amino group, an isocyanate group, a thiocyanate group, and an acyl chloride group, and n is an integer in a range of from 1 to 6.

5. The method of claim 1, wherein the second precursor has a general formula $R^2$—$(Y)_n$ wherein $R^2$ comprises one or more of an alkyl group, an alkenyl group, an aryl or aromatic group, and a cycloalkyl group, Yn comprises one or more of a hydroxide group, an aldehyde group, a ketone group, an acid group, an amino group, an isocyanate group, a thiocyanate group, and an acyl chloride group, and n is an integer in a range of from 1 to 6.

6. The method of claim 1, wherein the first precursor and the second precursor are independently selected from one or more of terephthaldehyde, phenylenediamine, ethylenediamine, hexamethylenediamine, terephthaloyl chloride, 1,3,5-benzenetricarbonyl trichloride, pyromellitic dianhydride, benzene-1,3,5-tricarboxaldehyde, 1,4-phenylene diisocyanate, 4,4'-oxydianiline, and tris(2-aminoethyl)amine.

7. The method of claim 6, wherein the first precursor comprises terephthaldehyde and the second precursor comprises phenylenediamine.

8. The method of claim 1, further comprising depositing at least one additional carbon-containing layer on the carbon-containing layer, wherein the carbon-containing layer and the at least one additional carbon-containing layer form the carbon-containing layer on the carbon-containing surface of the substrate.

9. The method of claim 1, wherein removing the first precursor comprises:

flowing a purge gas over the substrate; and removing a mixture of the first precursor effluent and the purge gas from the substrate.

10. The method of claim 9, wherein the purge gas is selected from argon (Ar), helium (He), and nitrogen ($N_2$).

11. The method of claim 1, further comprising patterning the substrate to expose the hardmask layer.

12. A method of selectively depositing a film, the method comprising:

treating a substrate comprising a carbon-containing surface and a silicon-containing surface with one or more of ozone or hydrogen peroxide to form hydroxide groups on the silicon-containing surface, wherein the carbon-containing surface is a chemical amplified resist (CAR) layer and the silicon-containing surface is a spin-on-glass layer, the spin-on-glass layer on a hardmask layer on a target layer, and wherein the carbon-containing surface has at least one feature formed therein, the at least one feature having a bottom surface that is the silicon-containing surface;

exposing the silicon-containing surface and the hydroxide groups to an alkylating precursor to form a passivated surface, wherein the alkylating precursor has a general formula (A)

(A)

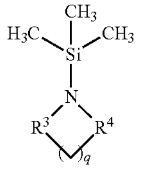

wherein $R^3$ and $R^4$ independently comprise one or more of hydrogen, an alkyl group, a halide, an alkenyl group, an aryl or aromatic group, a cycloalkyl group, and a trimethylsilyl group ($Si(CH_3)_3$), and wherein q is an integer in a range of from 0 to 5;

flowing a first precursor over the substrate, the first precursor having a general formula $R^1$—(X)n wherein $R^1$ comprises one or more of an alkyl group, an alkenyl group, an aryl or aromatic group, and a cycloalkyl group, $X_n$ comprises one or more of a hydroxide group, an aldehyde group, a ketone group, an acid group, an amino group, an isocyanate group, a thiocyanate group, and an acyl chloride group, and n is an integer in a range of from 1 to 6, wherein the first precursor reacts with a reactive group on the carbon-containing surface to form a first portion of a carbon-containing layer on the carbon-containing surface;

removing a first precursor effluent comprising the first precursor from the substrate;

flowing a second precursor over the substrate to form a carbon-containing layer on the carbon-containing surface and not on the passivated surface, the second precursor having a general formula $R^2$—$(Y)_n$ wherein $R^2$ comprises one or more of an alkyl group, an alkenyl group, an aryl or an aromatic group, and a cycloalkyl group, Yn comprises one or more of a hydroxide group, an aldehyde group, a ketone group, an acid group, an amino group, an isocyanate group, a thiocyanate group, and an acyl chloride group, and n is an integer in a range of from 1 to 6, wherein the second precursor reacts with the first portion to form the carbon-containing layer; and removing a second precursor effluent comprising the second precursor from the substrate.

13. The method of claim 12, wherein the first precursor and the second precursor are independently selected from one or more of terephthaldehyde, phenylenediamine, ethylenediamine, hexamethylenediamine, terephthaloyl chloride, 1,3,5-benzenetricarbonyl trichloride, pyromellitic dianhydride, benzene-1,3,5-tricarboxaldehyde, 1,4-phenylene diisocyanate, 4,4'-oxydianiline, and tris(2-aminoethyl) amine.

14. The method of claim 12, further comprising depositing at least one additional carbon-containing layer on the carbon-containing layer, wherein the carbon-containing layer and the at least one additional carbon-containing layer form the carbon-containing layer on the carbon-containing surface of the substrate.

15. The method of claim 12, wherein removing the first precursor comprises:

flowing a purge gas over the substrate, wherein the purge gas is selected from argon (Ar), helium (He), and nitrogen ($N_2$); and removing a mixture of the first precursor effluent and the purge gas from the substrate.

16. The method of claim 12, further comprising patterning the substrate to expose a hardmask layer.

17. The method of claim 1, wherein the carbon-containing layer has a selectivity ratio of the carbon-containing surface to the silicon-containing surface of at least 100:1.

18. The method of claim 1, wherein the carbon-containing layer has a thickness of about 50 nm to about 300 nm.

19. The method of claim 12, wherein the carbon-containing layer has a selectivity ratio of the carbon-containing surface to the silicon-containing surface of at least 100:1.

20. The method of claim 12, wherein the carbon-containing layer has a thickness of about 50 nm to about 300 nm.

* * * * *